(12) United States Patent
Sunohara (10) Patent No.: US 8,119,932 B2
(45) Date of Patent: Feb. 21, 2012

(54) WIRING BOARD AND METHOD OF MANUFACTURING THE SAME

(75) Inventor: Masahiro Sunohara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 544 days.

(21) Appl. No.: 12/349,780

(22) Filed: Jan. 7, 2009

(65) Prior Publication Data

US 2009/0183910 A1 Jul. 23, 2009

(30) Foreign Application Priority Data

Jan. 22, 2008 (JP) ................................. 2008-011072

(51) Int. Cl.
*H05K 1/11* (2006.01)

(52) U.S. Cl. ....................................................... 174/267

(58) Field of Classification Search .................. 174/262, 174/267, 266
See application file for complete search history.

(56) References Cited

U.S. PATENT DOCUMENTS

| | | | | |
|---|---|---|---|---|
| 4,211,603 A | * | 7/1980 | Reed | 216/18 |
| 5,142,775 A | * | 9/1992 | Wiley | 29/852 |
| 5,224,265 A | * | 7/1993 | Dux et al. | 29/852 |
| 5,949,030 A | * | 9/1999 | Fasano et al. | 174/262 |
| 7,419,382 B2 | * | 9/2008 | Suzuki et al. | 439/70 |
| 7,906,404 B2 | * | 3/2011 | DeNatale et al. | 438/386 |
| 2008/0258267 A1 | | 10/2008 | Nakashima | |

FOREIGN PATENT DOCUMENTS

JP 2006-228947 A1 8/2006

* cited by examiner

*Primary Examiner* — Chau Nguyen
(74) *Attorney, Agent, or Firm* — Kratz, Quintos & Hanson, LLP (57) ABSTRACT

First, a structure is fabricated by directly bonding a first base material and a second base material. The first base material has a recessed portion formed in a desired patterning layout on one surface thereof, and the bonding is performed in such a manner that the surface having the recessed portion of the first base material faces inward. Then, through holes are formed at desired positions in the structure in such a manner that the through holes pierce the structure in a direction of thickness thereof and communicate with the corresponding recessed portions. Further, an insulating layer is formed on the surface of the structure, and thereafter, a conductive material is filled into the through holes and the recessed portions.

4 Claims, 5 Drawing Sheets

WIRING BOARD AND METHOD OF MANUFACTURING THE SAME

CROSS-REFERENCE TO RELATED APPLICATIONS

This application is based on and claims priority of Japanese Patent Application No. 2008-11072 filed on Jan. 22, 2008, the entire contents of which are incorporated herein by reference.

BACKGROUND OF THE INVENTION (a) Field of the Invention

The present invention relates to a technique of manufacturing a wiring board for use in mounting an electronic component such as a semiconductor element. More particularly, it relates to a wiring board (hereinafter also referred to as "semiconductor package") which includes a multilayer wiring structure adapted for high density and multiple functions and which has a core substrate with a novel structure for use as a base material, and also to a method of manufacturing the same.

(b) Description of the Related Art

A semiconductor package such as BGA (ball grid array), LGA (land grid array), PGA (pin grid array), or the like, is generally manufactured in the following manner. First, a core layer (a core substrate) is prepared as a base material for the package. Then, a multilayer wiring structure is formed on both surfaces of the core layer, for example, by a build-up method, in which the formation of a conductive pattern (a wiring layer), the formation of an insulating layer, and the formation of a via hole in the insulating layer are repeated in this order. Finally, the outermost wiring layer is coated with a protection film (a solder resist layer), and an opening is formed in a desired position in the protection film to thereby expose a portion (a pad portion or a land portion) of the conductive pattern through the opening. Furthermore, in the case of BGA or PGA, a ball, a pin or the like to function as an external connection terminal is bonded to the exposed pad portion or the like. In such a semiconductor package, a chip such as a semiconductor element is mounted on one surface side thereof, and an external connection terminal is provided on the other surface side. The semiconductor package is then mounted on a packaging board such as a printed circuit board, through the external connection terminal. In other words, the chip and the packaging board are electrically connected to each other with the semiconductor package interposed therebetween.

To this end, the core substrate of the semiconductor package has a through hole formed therethrough as means for providing electrical connection between both surfaces of the core substrate, and the through hole has a conductive material (a conductor) filled therein. The wiring layer formed on one surface side of the core substrate and the wiring layer formed on the opposite surface side thereof are electrically connected to each other via the conductor (hereinafter also referred to as "through-hole electrode") filled in the through hole.

An example of techniques related to the above-mentioned conventional art is disclosed in Japanese unexamined patent Publication (JPP) (Kokai) 2006-228947. A method of manufacturing a semiconductor device described in this publication is as follows. First, a first support is mounted on a front surface of a substrate. Then, the substrate is thinned on the back surface thereof. Thereafter, the first support is removed from the substrate, and a second support having an opening is mounted on the back surface of the substrate. A first insulating film is then formed on the front surface of the substrate, and a through hole is formed in the substrate so as to be linked to the opening of the second support. Sequentially, a second insulating film is formed in the through hole of the substrate, and thereafter, an electrical conductor is filled into the through hole of the substrate.

In the conventional wiring board with multilayer wiring structure as mentioned above, the through-hole electrode is formed in the core substrate for use as the base material for the wiring board, and the wiring layers are stacked by the build-up method one on top of another on both surfaces of the core substrate in such a manner as to be connected to the through-hole electrode.

This leads to the need for the formation of a considerable number of wiring layers on both surfaces of the core substrate, and in turn, to a problem in that the entire thickness of the wiring board is increased. In particular, the utilization of the wiring board as a package for a CPU requires the formation of a considerably larger number of wiring layers because of the need for stacking a considerable number of wiring layers for use as power supply layers or ground layers, as compared to the number of wiring layers for use as signal layers. In this case, the above problem is more remarkable.

Also, the conventional process requires separate steps for a process (such as a plating process) for forming the through-hole electrode in the core substrate and a process (such as a plating process) for forming build-up wirings. In particular, the utilization of the wiring board as a package for a CPU requires the use of the build-up method for stacking a considerably larger number of wiring layers, and thus causes an increase in the number of steps, resulting in a problem of a rise in manufacturing cost.

SUMMARY OF THE INVENTION

An object of the present invention is to provide a wiring board and a method of manufacturing the same, which are capable of minimizing the entire thickness of the wiring board and also of achieving simplification of a process and hence contributing to a reduction in cost.

According to one aspect of the invention, there is provided a wiring board including a core substrate and wiring layers stacked on at least one surface of the core substrate, the core substrate including: a first base material in the form of a flat board, having a recessed portion formed in a desired pattern on one surface thereof; a second base material in the form of a flat board, directly bonded to and laminated on the surface of the first base material on which the recessed portion is formed; a through hole formed at a desired position in the laminated structure formed of the first and second base materials, in such a manner as to pierce the structure in a direction of thickness thereof and to communicate with the recessed portion; and a conductive material integrally filled into the through hole and the recessed portion.

According to the configuration of the wiring board according to this aspect, the conductive material (the conductor) filled into the recessed portion in the core substrate constitutes an inner wiring. In other words, some of the wiring layers (inner wirings) are provided inside the core substrate, and accordingly, some of a considerable number of wiring layers provided externally of the core substrate as in the prior art can be replaced by the inner wirings. Thus the present invention eliminates the need for provision, externally of the core substrate, of some of the wiring layers provided externally of the core substrate as in the prior art, and thereby enables a reduction in the entire thickness of the wiring board inclusive of the core substrate.

According to another aspect of the invention, there is provided a method of manufacturing a wiring board, including: forming a recessed portion in a desired pattern on one surface of a first base material in a form of a flat board thinned to a desired thickness; preparing a second base material in the form of a flat board thinned to a desired thickness, and directly bonding and thereby laminating the second base material to the surface of the first base material on which the recessed portion is formed; forming a through hole at a desired position in the laminated structure formed of the first and second base materials in such a manner that the through hole pierces the structure in a direction of thickness thereof and communicates with the recessed portion; forming an insulating layer on the surface of the structure in which the through hole is formed; and filling a conductive material into the through hole and the recessed portion in the structure coated with the insulating layer.

According to the method of manufacturing a wiring board according to this aspect, the formation of the inner wiring (the conductor filled into the recessed portion) takes place simultaneously with the formation of the through-hole electrode (the conductor filled into the through hole). Thus, this method can achieve simplification of the process, as compared to the conventional method that requires separate steps for a process (such as a plating process) for forming the through-hole electrode in the core substrate and a process (such as a plating process) for forming build-up wiring. This contributes to a reduction in manufacturing cost.

Description is given with reference to the following embodiments of the invention with regard to other features in configuration or process of the wiring board and the method of manufacturing the same according to the present invention, characteristic advantages based on the features thereof, and so on.

DESCRIPTION OF THE PREFERRED EMBODIMENTS

Description is given below with regard to preferred embodiments of the present invention with reference to the accompanying drawings.

Figure 1:
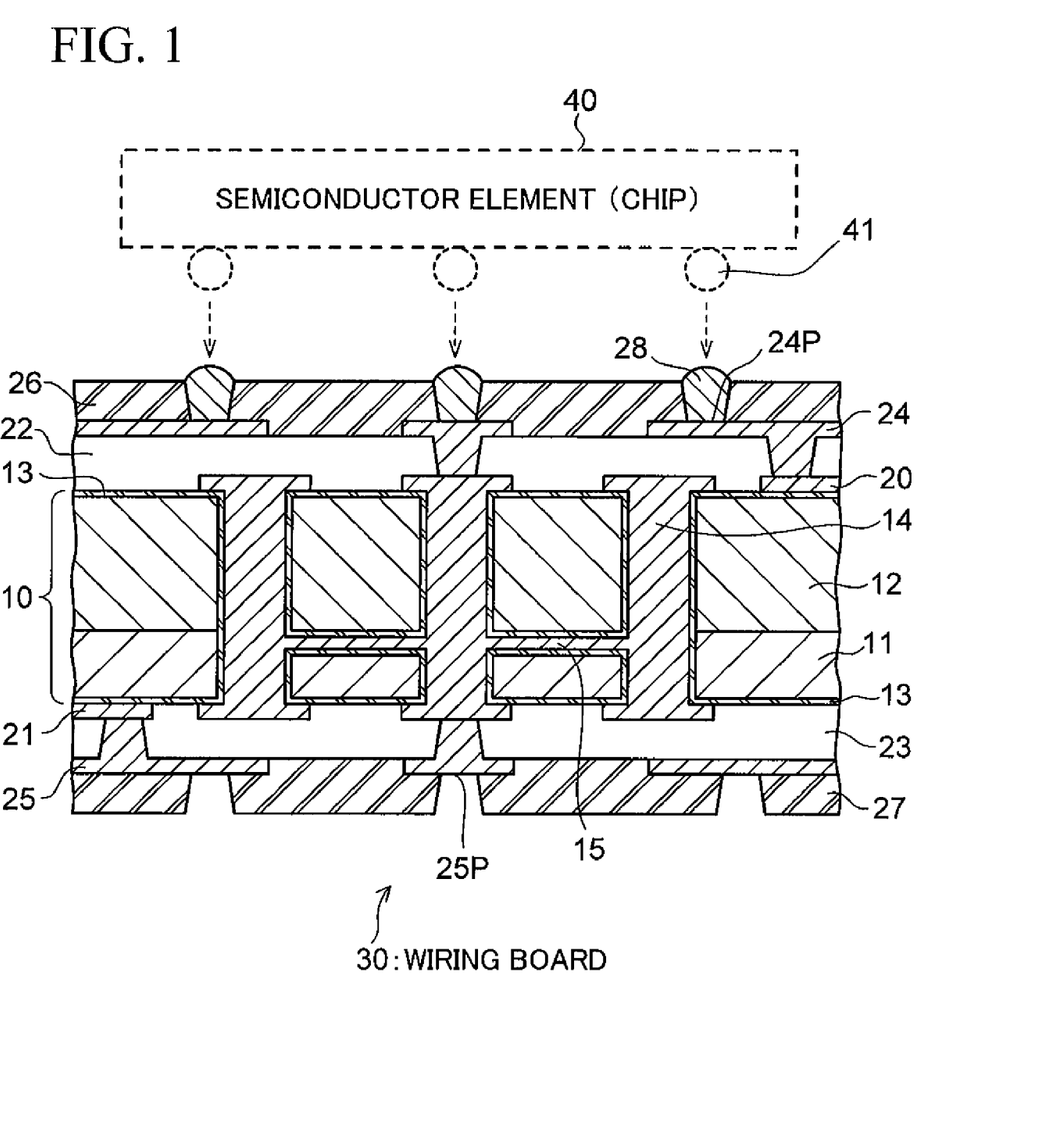
FIG. 1 is a sectional view showing a configuration of a wiring board (a semiconductor package) according to one embodiment of the present invention.

FIG. 1 shows in a sectional form a configuration of a wiring board according to one embodiment of the present invention. The illustrated example shows that an electronic component (a chip) 40 such as a semiconductor element can be mounted on a surface of a wiring board 30 according to the embodiment via electrode terminals 41 of the electronic component 40.

As shown in FIG. 1, the wiring board 30 according to the embodiment includes a core layer (a core substrate) 10 to serve as a base material for the wiring board 30; wiring layers 20 and 21 formed in desired patterning layouts on both surfaces, respectively, of the core substrate 10; insulating layers 22 and 23 formed on both surfaces so as to cover the wiring layers 20 and 21, respectively, and having via holes which are formed at desired positions and which reach pad portions of the wiring layers 20 and 21, respectively; wiring layers 24 and 25 formed in desired patterning layouts on the insulating layers 22 and 23, respectively, so as to fill the via holes; and insulating layers 26 and 27 as protection films formed so as to cover both surfaces exclusive of pad portions 24P and 25P defined at desired positions on the wiring layers 24 and 25, respectively. Copper (Cu) is typically used as a material for the wiring layers 20, 21, 24 and 25; epoxy resin is typically used as a material for the insulating layers 22 and 23; and solder resist is used as a material for the outermost insulating layers 26 and 27.

Also, it is desirable that the pad portions (Cu) 24P and 25P be plated with nickel (Ni) and gold (Au) in this order, since external connection terminals (the electrode terminals 41 of the chip 40 to be mounted on the wiring board 30, and solder balls, pins or the like for use in mounting the wiring board 30 on a motherboard such as a printed wiring board) are bonded to the pad portions 24P and 25P, respectively, exposed from the outermost insulating layers 26 and 27. This is for the purpose of improving contact bonding properties when the external connection terminals are bonded to the pad portions, and for the purpose of enhancing adhesion between the Cu layer constituting the pad portions 24P and 25P, and the Au layer, and thereby preventing Cu from diffusing into the Au layer.

In the embodiment, as shown in FIG. 1, the pad portions 24P on the chip mounting surface side have solder 28 deposited thereon so that the pad portions 24P are easily connected to the electrode terminals 41 of the chip 40 on the occasion of mounting of the chip 40 for the convenience of customers. On the other hand, the pad portions 25P on the side opposite to the chip mounting surface side remain exposed so that the external connection terminals can be bonded to the pad portions 25P on the customers' premises as needed. Of course, it will be understood that the solder balls, the pins or the like may be bonded in advance to the pad portions 25P according to customers' demands.

The core substrate 10 characterizing the present invention is basically made of a laminated structure formed by two flat boards of base materials 11 and 12 directly bonded to each other. Specifically, recessed portions (the portions denoted by reference RP in FIGS. 3C and 3D) are formed in desired patterning layouts at desired positions on one surface of the one base material 11 (on the upper side in the illustrated example), and the base material 11 is bonded directly to the other base material 12 in such a manner that the surface having the recessed portions of the base material 11 faces inward. In the embodiment, a silicon (Si) wafer is used as a material for each of the base materials 11 and 12. The base materials 11 and 12 are also referred to as "silicon boards" for the sake of convenience. Through holes (portions denoted by reference TH in FIG. 4C) are formed in desired portions in the laminated structure formed of the silicon boards 11 and 12, in such a manner that the through holes TH pierce the structure in the direction of thickness thereof and communicate with the recessed portions RP. Further, an insulating layer 13 is formed on the surface of the structure in which the through holes TH communicating with the recessed portions RP are formed (inclusive of the inner wall surfaces of the through holes TH and the recessed portions RP). Thermal oxidation method or the like can be used to form the insulating layer 13.

In the embodiment, as is described later, a conductive material (conductor) is integrally filled into the through holes TH and the recessed portions RP, and the conductors filled into each of these portions forms a through-hole electrode 14 and inner wiring 15, respectively. Electroless plating or electroplating, or alternatively, conductive paste or the like, may be used to form the through-hole electrode 14 and the inner wiring 15.

At the time of the plating (alternatively at the time of the filling with the conductive paste or the like), a plating solution (alternatively the conductive paste or the like) flows through the through holes TH and into the recessed portions RP. Since the recessed portion RP is very narrow (about 5 µm thick in the embodiment) as compared to the diameter of the through hole TH (about 50 µm in the embodiment), the recessed portion RP can be reliably filled with the conductive material, provided that the plating solution or the like travels a relatively short distance around the through hole TH (a distance on the order of 50 µm, which is the same as the diameter of the through hole TH). Thus, the inner wiring 15 formed in the core substrate 10 (the conductor in the recessed portion RP) is formed by patterning so as to form a connection between the adjacent through-hole electrodes 14 (the conductors in the through holes TH).

Figure 2A:
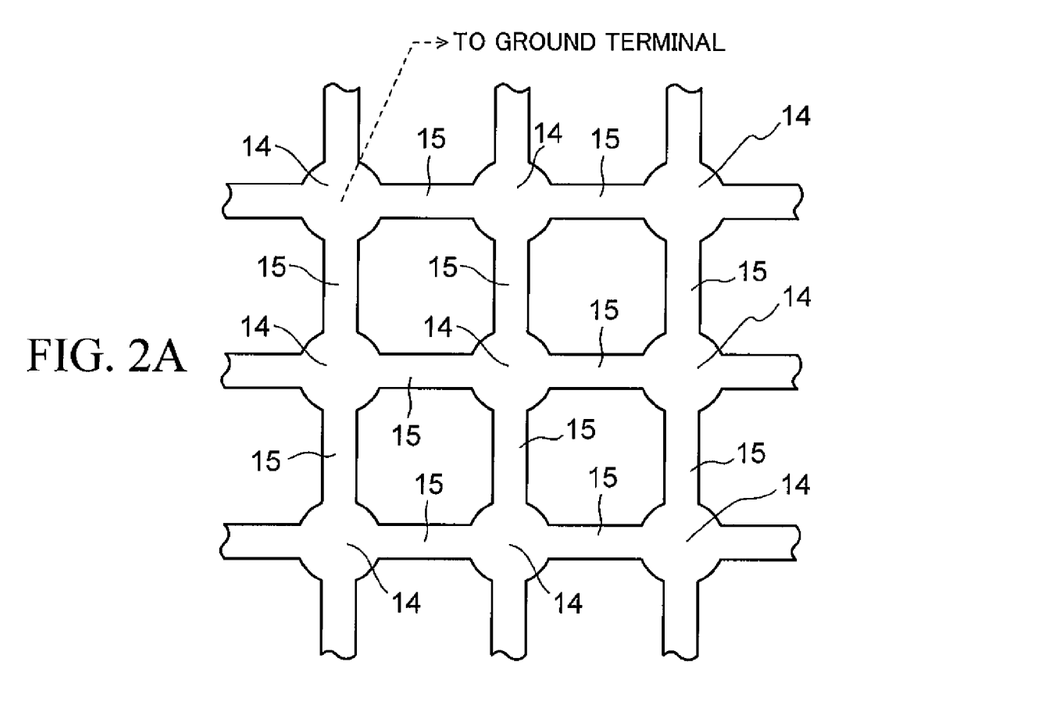
FIGS. 2A and 2B are plan views showing, in a schematic form, examples of a patterning layout of the principal portion (inner wiring) of a core substrate for the wiring board shown in FIG. 1.
Figure 2B:
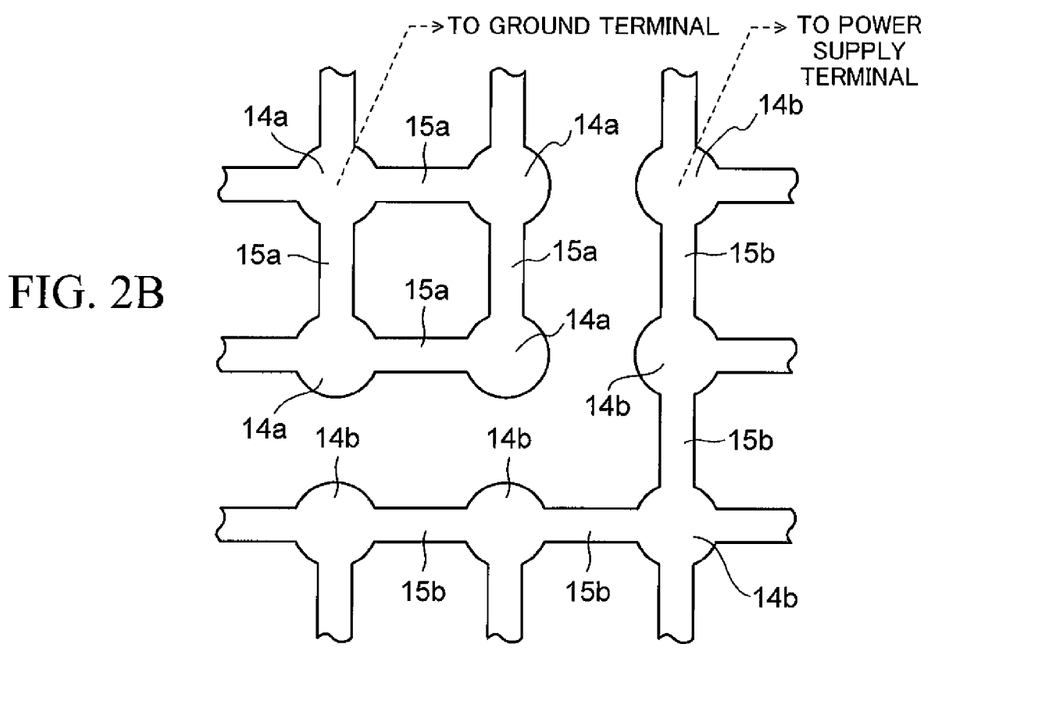

FIGS. 2A and 2B show, in a schematic form, examples of the patterning layout of the inner wiring 15, and the inner wiring 15 is continuous via the adjacent through-hole electrodes 14 as shown in FIGS. 2A and 2B. The example in FIG. 2A shows a layout in which the through-hole electrodes 14 are integrally connected by sharing a conductor (the inner wiring 15). The example in FIG. 2B shows a layout in which through-hole electrodes 14a belonging to one of two separate groups are integrally connected by sharing a conductor (inner wiring 15a), and through-hole electrodes 14b belonging to the other group are integrally connected by sharing a conductor (inner wiring 15b).

Since there are restrictions on the layout of the inner wiring 15 as shown in FIGS. 2A and 2B, it is actually difficult to form a complicated pattern like a signal wiring pattern, such as a pattern in which the inner wiring bypasses adjacent through-hole electrodes and provides a connection to a through-hole electrode in a remote location, or a pattern in which the inner wiring provides a selective connection between two given through-hole electrodes. Thus, there are limitations on the application of the inner wiring 15 (15a, 15b) formed in the core substrate 10.

On the other hand, in the state of the art, the utilization of the wiring board as a package for a CPU requires the repeated formation of wiring layers (about four to eight layers) on both surfaces of the core substrate, and the number of wiring layers in practical use as signal layers is about one or two. The other wiring layers are all utilized as power supply layers or ground layers, and, in almost all cases, these wiring layers are plane layers formed to have an unpatterned surface, rather than a fine and complicated pattern such as the signal wiring. Therefore, the inner wiring 15 (15a, 15b) formed in the core substrate 10 can be preferably utilized as a power supply plane or a ground plane, using any one of the patterning layouts shown in FIGS. 2A and 2B.

As shown in FIG. 1 and FIGS. 2A and 2B, the wiring board 30 according to the embodiment is characterized by the provision of the inner wiring 15 (15a, 15b) in the core substrate 10. Specific description is given with regard to the materials for structural members that constitute the wiring board 30 including the core substrate 10, the sizes of the structural members, and so on, in connection with the following process.

Description is given below with regard to a method of manufacturing the wiring board 30 according to the embodiment with reference to FIGS. 3A to 5C showing manufacturing steps in order. Note that examples of steps each show only the configuration of a portion (core substrate 10) associated with the present invention for simplicity of illustration.

First, at the first step (FIG. 3A), a silicon (Si) wafer having a diameter of 8 inches and a thickness of about 725 µm is prepared, and is thinned to a thickness of about 100 µm (silicon board 11). Processing techniques such as chemical polishing, chemical mechanical polishing (CMP) or plasma etching can be used for a thinning process.

At the next step (see FIG. 3B), an etching resist is formed on one surface of the thinned silicon board 11 (on the upper side in the illustrated example), using a patterning material, and openings are formed at desired positions in the resist (a resist layer R1 having openings OP1 is formed). The openings OP1 are formed by patterning in the patterning layout of the inner wirings 15 in the core substrate 10 to be formed, namely, such a layout as to form a connection between the adjacent through-hole electrodes 14 (14a, 14b). A photosensitive dry film, or a liquid photoresist (a liquid resist such as a novolak-base resin or an epoxy-base resin) can be used as the patterning material.

For example, where the dry film is used, the resist layer R1 is formed by means of patterning through process steps of: surface cleaning; pre-lamination (separator sheet delamination); resist lamination in the air; exposure; cover sheet delamination; and development. Specifically, the formation of the resist layers R1 involves first cleaning the surfaces of the silicon board 11; then laminating the dry film onto the surface of the silicon board 11 by means of thermocompression bonding; curing the dry film by exposing the dry film to ultraviolet (UV) irradiation using masks (not shown) formed in the desired layouts of the inner wiring by means of patterning; and further, etching away target areas using a predetermined developing solution (an organic-solvent-containing developing solution for a negative resist or an alkali-base developing solution for a positive resist) (forming the openings OP1), thereby yielding the resist layers R1 according to the desired patterning layouts. Where the liquid photoresist is used, the resist layers R1 can be likewise formed in the desired shapes by means of patterning through process steps of: surface cleaning; resist coating on the surface; drying; exposure; and development.

At the next step (FIG. 3C), the silicon board 11 is subjected to etching in portions exposed from the openings OP1 of the resist layer R1 (FIG. 3B) to a desired thickness of about 5 to 10 µm by a dry etching method such as reactive ion etching (RIE), using the patterned resist layer R1 as a mask, and thereby, the recessed portions RP are formed. Although $SF_6/O_2$ gas or $CF_4/O_2$ gas may be used for the RIE, the former ($SF_6/O_2$ gas) is preferable in that it has a high etching rate.

At the next step (FIG. 3D), the resist layer R1 used as the etching resist (FIG. 3C) is removed. For example, where the dry film is used as the etching resist, an alkaline chemical liquid such as sodium hydroxide or a monoethanolamine-base liquid can be used for removal. Where the liquid resist such as a novolak-base resin or an epoxy-base resin is used as the etching resist, acetone, alcohol or the like can be used for removal. This results in fabrication of the silicon board 11 having the recessed portions RP formed in the patterning layout of the desired inner wiring on one surface, as shown in FIG. 3D.

Figure 3A:
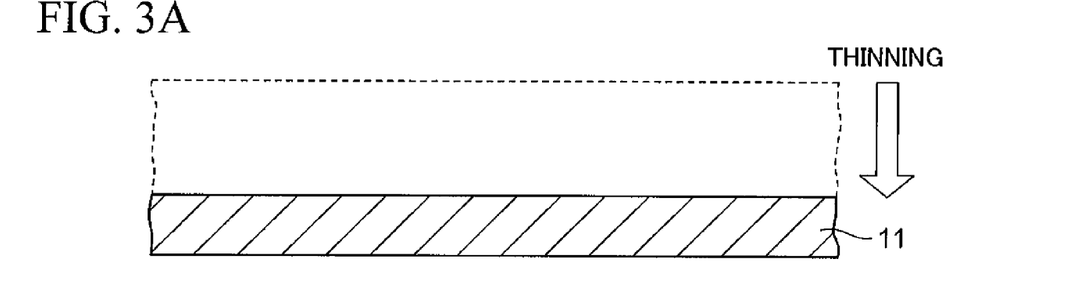
FIGS. 3A to 3D are sectional views showing steps in a method of manufacturing the wiring board (a portion of the core substrate) shown in FIG. 1.
Figure 3B:
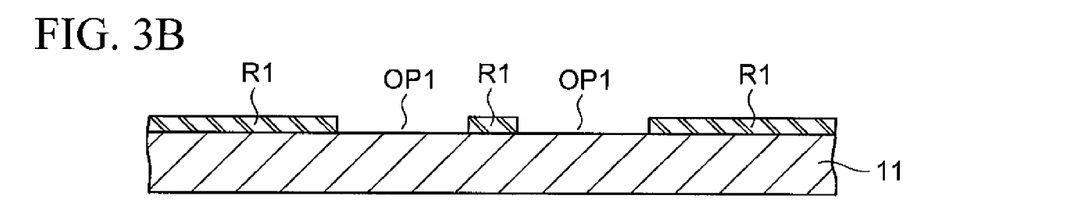
Figure 4A:
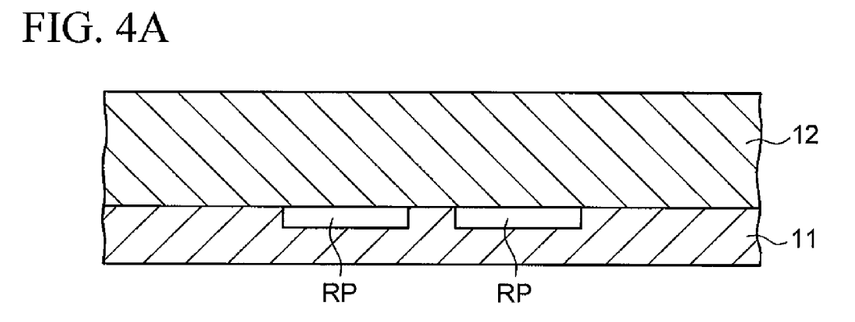
FIGS. 4A to 4C are sectional views showing manufacturing steps following the steps shown in FIGS. 3A to 3D.

At the next step (FIG. 4A), the fabricated silicon board 11, and the silicon board 12 fabricated by being thinned to a predetermined thickness (about 200 µm) in the same manner as the process performed at the step shown in FIG. 3A, are directly bonded together in such a manner that the surface having the recessed portions RP of the base material 11 faces inward. This bonding can be accomplished by first cleaning the surfaces of the silicon boards 11 and 12; then providing an alignment between the silicon boards 11 and 12 in a vacuum atmosphere as shown in FIG. 4A; and then heating (sintering) the silicon boards 11 and 12 to a temperature of about 1000° C. and applying pressure to the silicon boards 11 and 12. In other words, the sintering induces a reaction between silicon atoms in the vicinity of the interface between the silicon boards 11 and 12, forms a bonding layer, and thereby provides a direct bond between the silicon boards 11 and 12.

At the next step (FIG. 4B), in the same manner as the process performed at the step shown in FIG. 3B, an etching resist is formed on one surface of the laminated structure of the two silicon boards 11 and 12 (on the upper side in the illustrated example), using a patterning material, and openings are formed at desired positions in the resist (a resist layer R2 having openings OP2 is formed). A photosensitive dry film or a liquid photoresist can be likewise used as the patterning material.

Figure 4B:
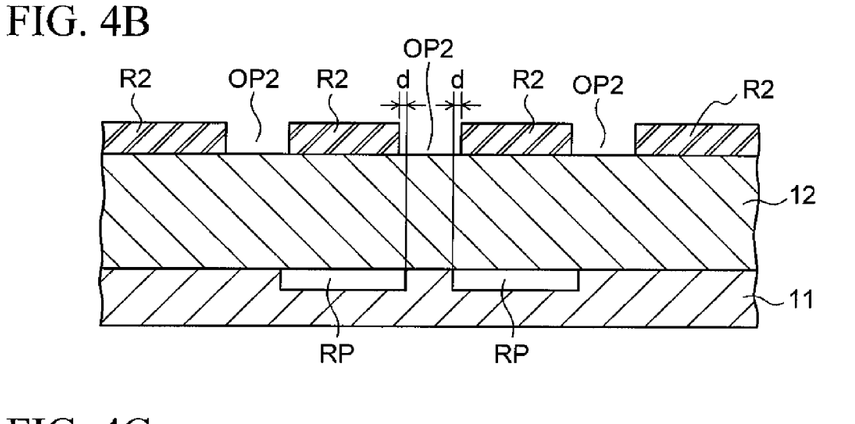

The openings OP2 to be formed in the resist layer R2 are formed in accordance with the patterning layout of through holes to be formed at the later step. Note, at the time of the patterning of the openings OP2, the size of each opening OP2 is selected so that the periphery of the opening OP2 partially overlaps the periphery of each of the recessed portions RP, as seen in a plan view. In other words, the openings OP2 are each formed in such a manner that a margin having a desired width (d=about 5 μm) is provided on both sides of a portion between the adjacent recessed portions RP, as shown in FIG. 4B. The reason for the formation of the openings OP2 of such a size that the periphery of each of the openings OP2 partially overlaps the periphery of each of the recessed portions RP as mentioned above is that the through holes, when formed, have to be communicated with the recessed portions RP.

Figure 3C:
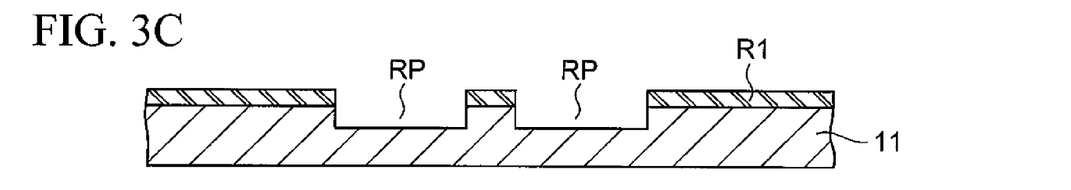
Figure 3D:
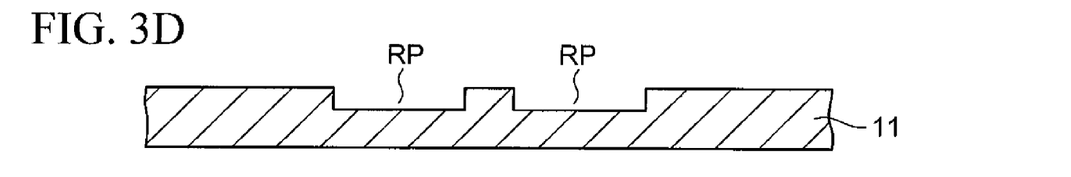
Figure 4C:
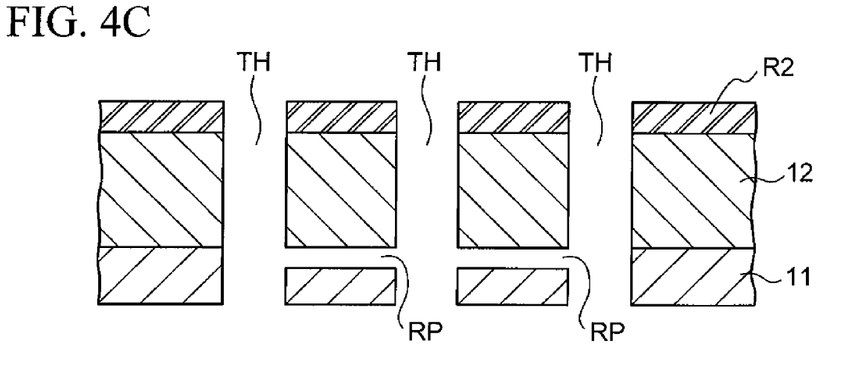

At the next step (FIG. 4C), in the same manner as the process performed at the step shown in FIG. 3C, the laminated structure of the two silicon boards 11 and 12 is subjected to etching in portions exposed from the openings OP2 of the resist layer R2 (FIG. 4B) by the dry etching method such as reactive ion etching (RIE), using the patterned resist layer R2 as a mask, in such a manner that the through holes pierce the structure in the direction of thickness thereof, and thereby, the through holes TH are formed. Since the opening OP2 are each formed with a given size as mentioned above, the through holes TH formed in accordance with the size of the openings OP2 reliably communicate with the recessed portions RP as shown in FIG. 4C.

Figure 5A:
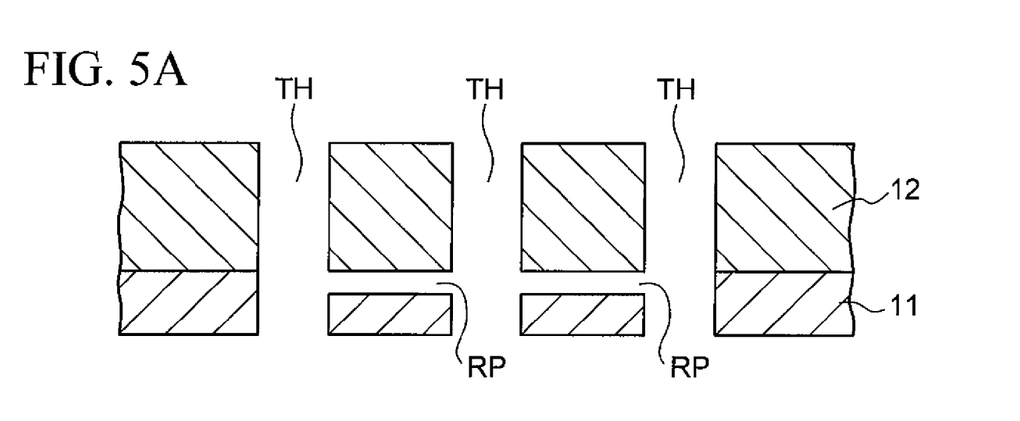
FIGS. 5A to 5C are sectional views showing manufacturing steps following the steps shown in FIGS. 4A to 4C.
Figure 5B:
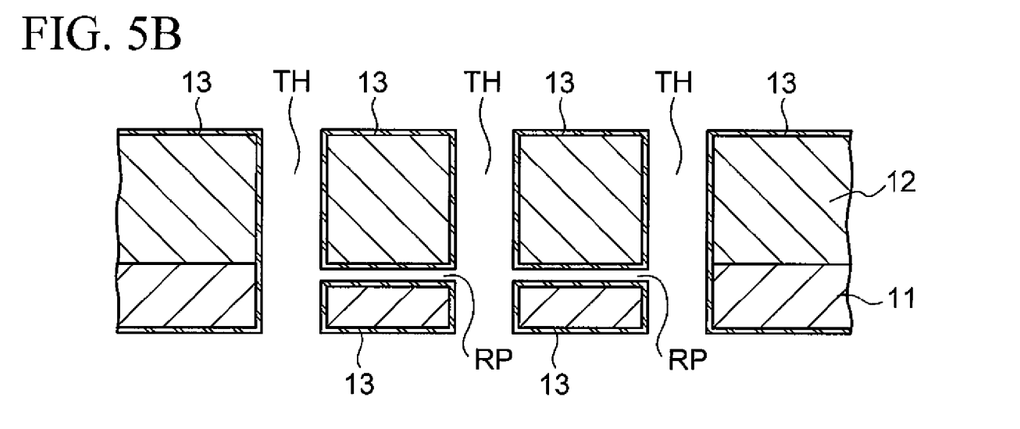

At the next step (FIG. 5A), the resist layer R2 (FIG. 4C) used as the etching resist is removed. The resist layer R2 can be removed in the same manner as the process performed at the step shown in FIG. 3D. Thereby, a structure is fabricated in which the through holes TH are formed at the desired positions in the laminated structure formed by bonding the two silicon boards 11 and 12, in such a manner that the through holes TH pierce the structure in the direction of thickness thereof and communicate with the recessed portions RP, as shown in FIG. 5A.

At the next step (FIG. 5B), the insulating layer 13 made of $SiO_2$ (a silicon oxide film) is formed in a thickness of about 1.5 μm on the surface of the fabricated structure (inclusive of the inner wall surfaces of the through holes TH and the recessed portions RP), for example, by a thermal oxidation method, a CVD (chemical vapor deposition) method or the like.

At the final step (FIG. 5C), a conductive material is integrally filled into the through holes TH and the recessed portions RP (FIG. 5B) in the structure whose surface is coated with the insulating layer 13 (the laminated structure of the silicon boards 11 and 12), and thereby, the through-hole electrodes 14 and the inner wirings 15 are formed (the core substrate 10 is completed). Thereafter, the wiring layers 20 and 21 are formed in the desired patterning layouts on both surfaces, respectively, of the core substrate 10. For example, the wiring layers 20 and 21 can be formed in the following manner.

Figure 5C:
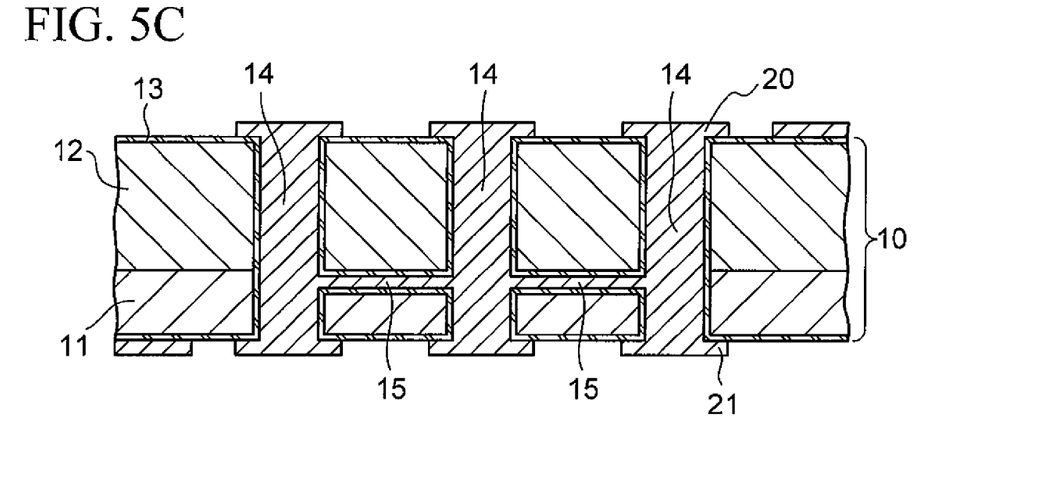

First, a seed layer is formed on the surface of the insulating layer 13 by copper (Cu) electroless plating, and then, the conductor (Cu) is filled into the through holes TH and the recessed portions RP by Cu electroplating utilizing the seed layer as a power feed layer. Alternatively, Cu electroless plating alone may be used for filling. Still alternatively, a screen printing method, an ink jet method or the like using conductive paste may be used to fill a conductive material containing metal such as Cu into the through holes TH and the recessed portions RP. Thereby, the plating solution or the like flows through the through holes TH and the recessed portions RP, so that these portions are integrally filled with the conductive material to thereby form through-hole electrodes 14 and inner wirings 15 as shown in FIG. 5C.

Further, Cu wiring patterns (the wiring layers 20 and 21) are formed in the desired pattern on both surfaces by a subtractive method, a semi-additive method, the ink jet method or the like, in such a manner that the Cu wiring patterns are connected to the conductors 14 filled into the through holes TH. The use of the semi-additive process or the ink jet process enables the formation of the wiring patterns 20 and 21 simultaneously with the filling of the conductor (Cu) into the through holes TH and the recessed portions RP, thereby contributing to simplification of the process.

The above steps results in the structure including the wiring layers 20 and 21 formed in the desired patterning layouts on both surfaces, respectively, of the core substrate 10 that characterizes the present invention.

Further, thereafter, the insulating layer (inclusive of via holes) and the conductor pattern (wiring layer) are alternately formed on both surfaces of the structure by the build-up method until the desired number of layers is obtained, which is not shown specifically. In the embodiment, as shown in FIG. 1, the insulating layers 22 and 23 and the wiring layers 24 and 25 are each formed on either side of the core substrate 10. Further, the solder resist layers 26 and 27 to respectively function as the protection films are formed so as to cover the entire surface exclusive of the pad portions 24P exposed on the upper side and the pad portions 25P exposed on the lower side. Further, the pad portions (Cu) 24P and 25P exposed from the solder resist layers 26 and 27, respectively, are Ni and Au plated. Then, the pad portions 24P on the chip mounting surface side are subjected to presoldering (the solder 28 is adhered to the pad portions 24P).

The above steps results in the manufacture of the wiring board 30 according to the embodiment (FIG. 1).

As described above, according to the configuration of the wiring board 30 and the method of manufacturing the same according to the embodiment of the present invention, the wiring layer 15 (15a, 15b) is provided in the core substrate 10, and thus, some of a considerable number of wiring layers provided externally of the core substrate as in the prior art can be replaced by the inner wirings. The conventional package for the CPU, in particular, requires the formation of a considerable number of wiring layers (majority thereof are the power supply or ground wiring layers) on both surfaces of the core substrate. On the contrary, in the embodiment, the wiring layers 15 (in particular, the ground wirings 15a or the power supply wirings 15b as shown in FIG. 2B) can be preferably built in the core substrate 10, and thus, it is not required that the power supply or ground wiring layers be provided externally of the core substrate 10. This enables a reduction in the entire thickness of the wiring board 30 (semiconductor package) inclusive of the core substrate 10.

Also, in the process according to the embodiment of the present invention, the formation of the inner wirings 15 (conductors in the recessed portions RP) takes place simultaneously with the formation of the through-hole electrodes 14 (conductors in the through holes TH) (see FIG. 5C). Accordingly, this process can achieve simplification of the process, as compared to the conventional process that requires separate steps for a process (such as a plating process) for forming the through-hole electrode in the core substrate and a process (such as a plating process) for forming build-up wiring. This contributes to a reduction in manufacturing cost.

Referring to the above-mentioned embodiment, description is given taking the case where the two silicon boards 11 and 12 are bonded together for the fabrication of the core substrate 10. However, of course, it will be understood that the number of silicon boards to be bonded together is not limited to two, as is also apparent from the gist of the present invention. For example, three silicon boards may be bonded together for the fabrication of the core substrate.

Also, the bonding of four or more silicon boards is technically possible; however, where the total thickness of the laminated boards is too great, it takes a considerable time to fill the conductive material (plating solution, conductive paste or the like) into the through holes TH and the recessed portions RP, which is performed at the final step (FIG. 5C). Also, the plating solution or the like flows through the through holes TH and into the recessed portions RP, and the recessed portion RP is very narrow as compared to the diameter of the through hole as mentioned above, and thus, too great a total thickness can possibly bring about a situation where the plating solution or the like does not smoothly flow into the recessed portions RP and thus the desired inner wirings 15 (15a, 15b) are not formed. Also, where the number of silicon boards is too large, it is necessary to relatively reduce the thickness of each individual silicon board, which in turn can possibly produce cracks and thus impair ease of handling. Desirably, the total thickness lies between about 300 μm and 400 μm, allowing for such restrictions, and it is appropriate that the number of silicon boards required for the total thickness is, at most, three.

A method for the fabrication of the core substrate formed of three silicon boards bonded together, although not specifically shown, is basically the same as the above-mentioned process (FIGS. 3A to 5C). Note, this method includes fabricating two silicon boards by performing two processes each equivalent to the above-mentioned process performed at the steps shown in FIGS. 3A to 3D (fabrication of the silicon board 11 having the recessed portions RP at desired positions on one surface); aligning a third silicon board (corresponding to the silicon board 12 shown in FIG. 4A) with the two silicon boards; and directly bonding the three silicon boards together.

The structure (core substrate) formed of three silicon boards bonded together can enhance the degree of freedom of the inner wiring, as compared to the above-mentioned embodiment. For example, the inner wiring between the first and second silicon boards can be assigned solely for a ground plane layer, and the inner wiring between the second and third silicon boards can be assigned solely for a power supply plane layer.

Note that, as a modified example of the core substrate formed of three silicon boards bonded together, one of the above-mentioned two silicon boards (the silicon board sandwiched therebetween), which has recessed portions formed in desired layouts on both surfaces, may be used. Also, it is not necessarily required that the third silicon board be flat on both surfaces as in the case of the above-mentioned embodiment, and the third silicon board having recessed portions formed in desired layouts on one surface (on the inwardly facing side) may be used. This form can achieve a higher degree of freedom of the inner wiring.

Also, referring to the above-mentioned embodiment, description is given taking the case where the silicon board is used as the base material forming the core substrate 10. However, it is to be understood that the base material for use is not necessarily limited to the silicon board, and other materials may be used. For example, glass (specifically, Pyrex glass (which is a trade name for borosilicate glass available from Corning Incorporated)) is technically available. Since the glass contains $SiO_2$ as its ingredient, the use of the glass as the base material eliminates the need for the above-mentioned process performed at the step shown in FIG. 5B (the formation of the insulating layer 13 on the surface of silicon by thermal oxidation or the like), thus contributing to the simplification of the process.

Note, other steps require particular processes. First, in the step shown in FIG. 3C, for example, blasting is used to form the recessed portion RP. The blasting is a surface treatment method that involves blasting compressed air or the like having silica sand, steel grit or the like mixed as abrasive therein, onto the surface of a target. In this case, fine abrasive grains (SiC#700) are blasted onto the glass base material exposed from the openings OP1 of the resist layer R1 (FIG. 3B) to thereby cut away a blasted portion under blasting pressure and thus form the recessed portions RP. Then, at the step shown in FIG. 4A, for example, a low-temperature glass bonding technique is used to bond two glass base materials together. Besides the low-temperature glass bonding, thermocompression bonding, ultrasonic bonding, glass fritting, plasma bonding, or the like, may be used.

What is claimed is:

1. A wiring board including a core substrate and wiring layers stacked on at least one surface of the core substrate, the core substrate comprising:

a first base material in the form of a flat silicon board, having a recessed portion formed in a desired pattern on one surface thereof;

a second base material in the form of a flat silicon board, directly bonded to and laminated on the surface of the first base material on which the recessed portion is formed;

an insulating layer formed on the surface of each silicon board;

a through hole formed at a desired position in the laminated structure formed of the first and second base materials, in such a manner as to pierce the structure in a direction of thickness thereof and to communicate with the recessed portion; and a conductive material integrally filled into the through hole and the recessed portion with the insulating layer interposed between the silicon board and the conductive material.

2. The wiring board according to claim 1, wherein a portion of the conductive material filled in the recessed portion in the core substrate is assigned as any one of a ground wiring and a power supply wiring.

3. A method of manufacturing a wiring board, comprising:
forming a recessed portion in a desired pattern on one surface of a first base material in a form of a flat board thinned to a desired thickness;
preparing a second base material in the form of a flat board thinned to a desired thickness, and directly bonding and thereby laminating the second base material to the surface of the first base material on which the recessed portion is formed;
forming a through hole at a desired position in the laminated structure formed of the first and second base materials in such a manner that the through hole pierces the structure in a direction of thickness thereof and communicates with the recessed portion;
forming an insulating layer on the surface of the structure in which the through hole is formed; and
filling a conductive material into the through hole and the recessed portion in the structure coated with the insulating layer.

4. The method according to claim 3, further comprising forming a resist layer having an opening at a desired position thereof, on one surface of the laminated structure, before forming the through hole, after directly bonding and thereby laminating the first base material and the second base material together,
wherein when the resist layer is formed, the opening is formed so as to have such a size that the periphery of the opening overlaps partially with that of the recessed portion, as seen in plan view, and
the through hole is formed in accordance with the shape of the opening.

* * * * *